United States Patent [19]

Murakami

[11] Patent Number: 5,499,446
[45] Date of Patent: Mar. 19, 1996

[54] METHOD FOR MANUFACTURING PRINTED CIRCUIT BOARD WITH THROUGH-HOLE

[75] Inventor: Tomoo Murakami, Tokyo, Japan

[73] Assignee: NEC Corporation, Tokyo, Japan

[21] Appl. No.: 349,991

[22] Filed: Nov. 29, 1994

[30] Foreign Application Priority Data

Dec. 1, 1993 [JP] Japan ................... 5-301394

[51] Int. Cl.⁶ ......................................... H01K 3/10
[52] U.S. Cl. ................... 29/852; 29/829; 29/846; 174/260; 174/262; 174/265
[58] Field of Search ............. 29/852, 829, 846; 427/97; 228/180.21; 179/260, 262, 265

[56] References Cited

U.S. PATENT DOCUMENTS

| | | | |
|---|---|---|---|
| 4,372,046 | 2/1983 | Suzuki | 29/846 X |
| 4,543,715 | 10/1985 | Iadarola et al. | 427/97 X |
| 4,790,894 | 12/1988 | Homma et al. | 228/180.21 X |
| 4,821,007 | 4/1989 | Fields et al. | 29/846 X |
| 5,140,745 | 8/1992 | McKenzie, Jr. | 427/97 X |

FOREIGN PATENT DOCUMENTS

| | | | |
|---|---|---|---|
| 62-43139 | 2/1987 | Japan . | |
| 62-169493 | 7/1987 | Japan . | |
| 1-290283 | 11/1989 | Japan . | |
| 2-94266 | 4/1990 | Japan . | |
| 3-52291 | 3/1991 | Japan . | |
| 3-106096 | 5/1991 | Japan | 427/97 |
| 3-160785 | 7/1991 | Japan | 29/829 |
| 3-187292 | 8/1991 | Japan | 427/97 |
| 3-209795 | 9/1991 | Japan . | |
| 4-71289 | 3/1992 | Japan | 427/97 |
| 5-327156 | 12/1993 | Japan . | |

*Primary Examiner*—Carl J. Arbes
*Attorney, Agent, or Firm*—Sughrue, Mion, Zinn, Macpeak & Seas

[57] ABSTRACT

A printed circuit board is manufactured by steps of forming on a laminate a plurality of penetrating holes, a plurality of semi-circular grooves, and a plurality of semi-circular through-holes. The plurality of penetrating holes are formed at predetermined locations along a straight line on the laminate board whose two surfaces are copper plated. The plurality of semi-circular grooves are formed from the penetrating holes which are cut into halves by a slit forming process. The plurality of semi-circular through-holes are formed using a jig member inserted into said slit and forming a copper plated layer on a surface of each of said semi-circular grooves. Highly reliable semi-circular through-holes can be formed because no peeling or burrs develop in the copper plated layer.

6 Claims, 7 Drawing Sheets

METHOD FOR MANUFACTURING PRINTED CIRCUIT BOARD WITH THROUGH-HOLE

BACKGROUND OF THE INVENTION

1. Field of the Invention

The present invention relates to a method for manufacturing a printed circuit board, and more particularly to a method for manufacturing a printed circuit board having semi-circular through-holes on an end thereof.

2. Description of the Related Art

Figure 1A:
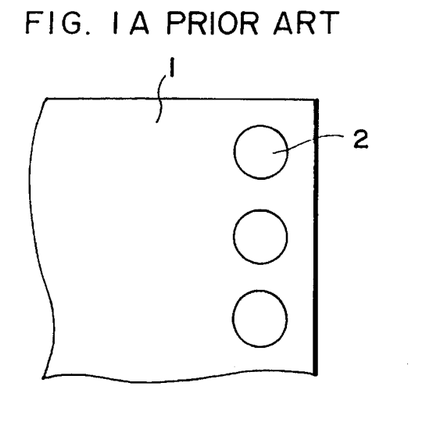
FIGS. 1A–1C are diagrammatic plan views of a first prior art printed circuit board for illustrating sequential process steps for manufacturing the same.
Figure 1B:
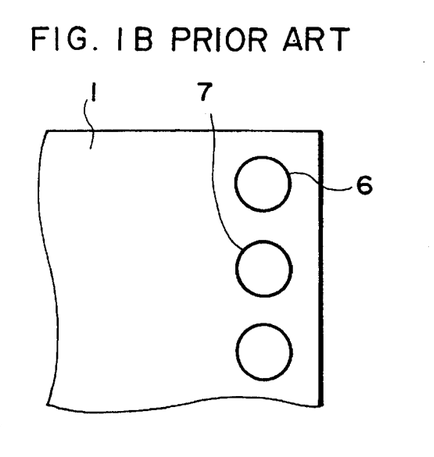
Figure 1C:
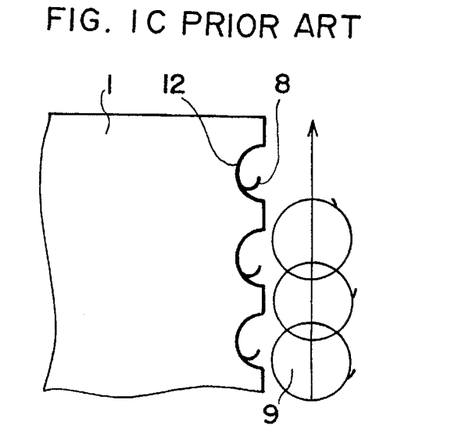
Figure 1D:
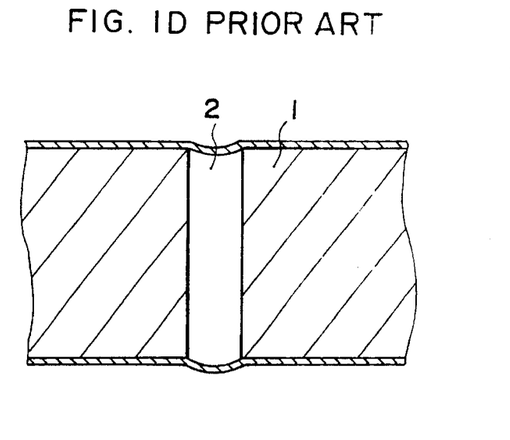
FIGS. 1D–1F are diagrammatic sectional views of the printed circuit board shown in FIGS. 1A–1C.
Figure 1E:
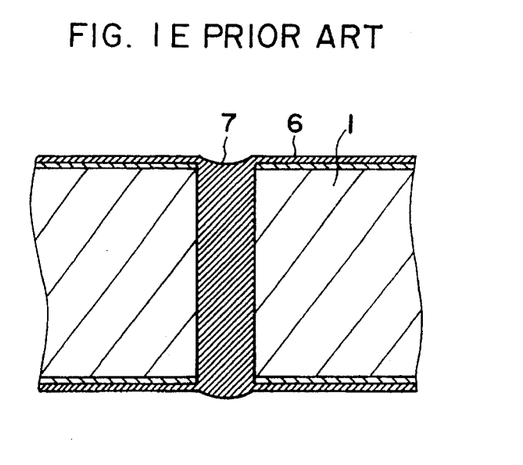
Figure 1F:
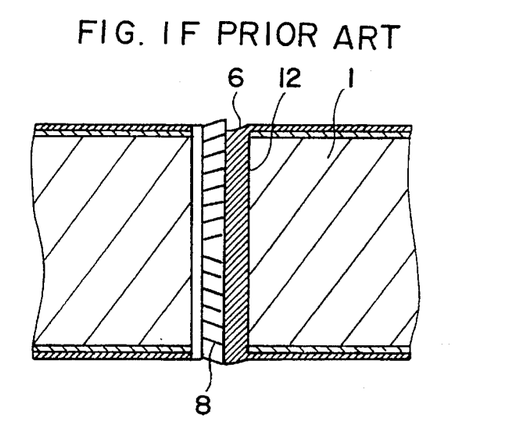

A conventional method for manufacturing a printed circuit board of the kind to which present invention relates is first explained to assist the understanding of the invention. As shown in FIGS. 1A and 1D, a plurality of holes 2 are provided along a straight line near an end face of a laminate board 1 whose two faces are copper plated. Next, as shown in FIGS. 1B and 1E, the entire surface including the holes 2 of the copper plated laminate board 1 is copper-plated thereby forming through-holes 7 each covered with a thick electro-plated copper film 6. Then, as shown in FIGS. 1C and 1F, each the through-holes 7 is cut into a half by a router processing along the center line whereby semi-circular through-holes 12 are formed (first prior art example).

Figure 2A:
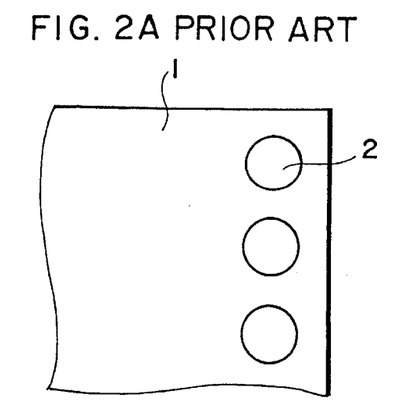
FIGS. 2A–2C are diagrammatic plan views of a second prior art printed circuit board for illustrating sequential process steps for manufacturing the same.
Figure 2B:
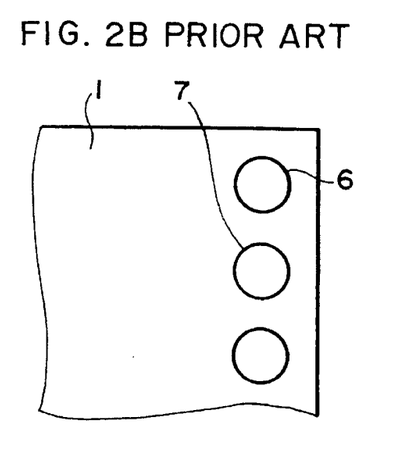
Figure 2C:
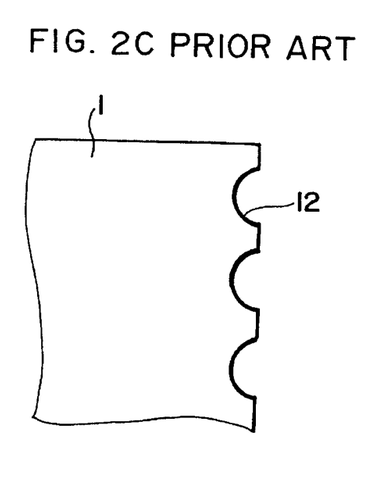
Figure 2D:
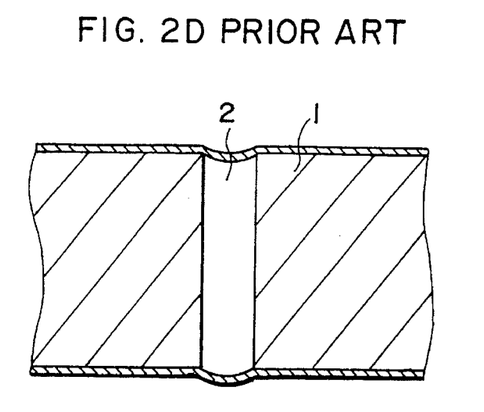
FIGS. 2D–2F are diagrammatic sectional views of the printed circuit board shown in FIGS. 2A–2C.
Figure 2E:
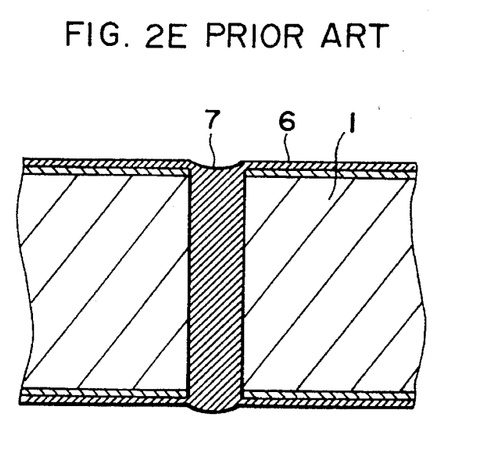
Figure 2F:
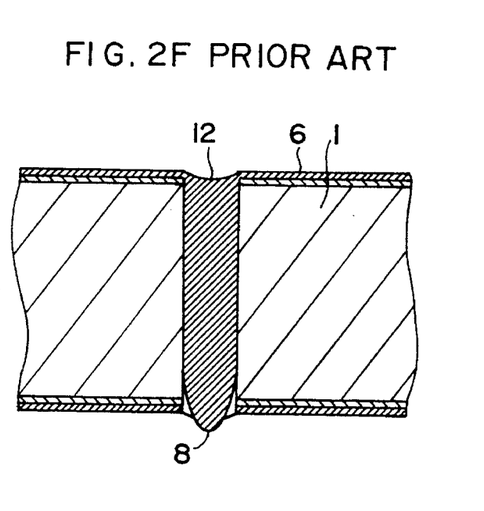

Also, as shown in FIGS. 2A and 2D, a plurality of holes 2 are formed in a laminate board 1 whose two surfaces are copper plated and, as shown in FIGS. 2B and 2E, plating is carried out thereby forming through-holes 7 each covered with a thick electro-plated copper layer 6. Then, as shown in FIGS. 2C and 2F, by using a press die prepared in advance for cutting each of the through-holes 7 into a half, a plurality of semi-circular through-holes 12 are formed (second prior art example).

Furthermore, there are conventional methods which improve the above described two methods for manufacturing printed circuit boards and which are disclosed respectively in Japanese Patent Application Kokai Publication No. Hei 3-52291 (third prior art example) and Japanese Patent Application Kokai Publication No. Hei 3-106096 (fourth prior art example).

Figure 3A:
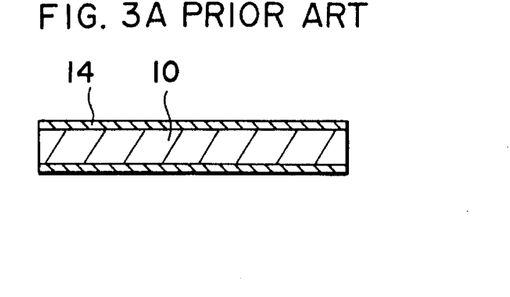
FIGS. 3A–3D are diagrammatic sectional views of a third prior art printed circuit board for illustrating sequential process steps for manufacturing the same.
Figure 3B:
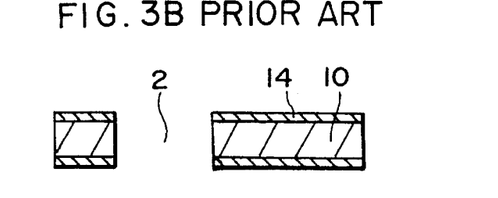
Figure 3C:
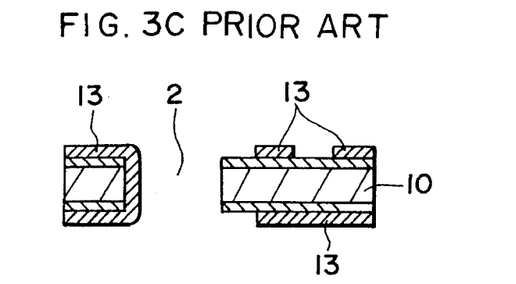
Figure 3D:
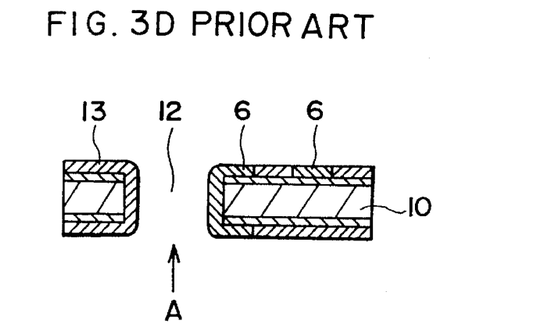
Figure 3E:
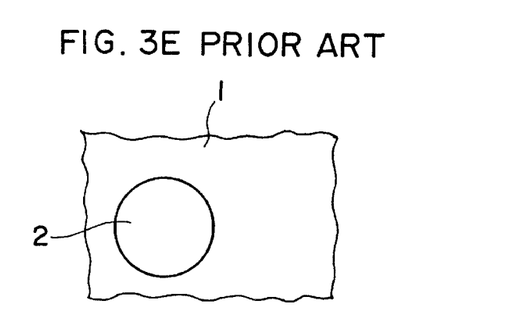
FIGS. 3E–3G are diagrammatic plan views of the printed circuit board shown in FIGS. 3B–3D.
Figure 3F:
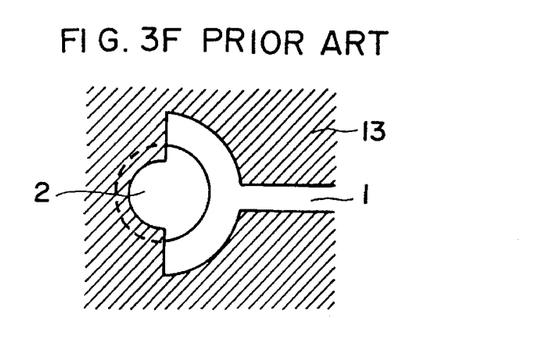
Figure 3G:
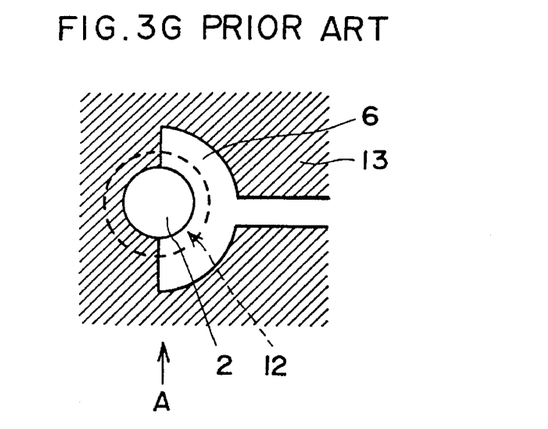

FIGS. 3A–3G show the third prior art example of a method for manufacturing a printed circuit board wherein a penetrating hole 2 or through-hole as shown in FIGS. 3B and 3E is provided in an insulating substrate 10 whose two surfaces are coated with bonding agent 14. Next, as shown in FIGS. 3C and 3F, a plating resist 13 is applied to cover a half of an inner wall of the penetrating hole 2 and a portion excepting a region with a wiring pattern. Then, as shown in FIGS. 3D and 3G, after the portion excepting a region with the plating resist 13 is plated by a thick electro-plated copper layer 6, a semi-circular through-hole 12 is formed by carrying out a slit-cutting process along a cutting line "A" passing through a center portion of the penetrating hole 2. In this slit-cutting process, the cutting takes place at a position slightly removed or deviated from the thick electro-plated cooper layer 6 so that there is no occurrence of burrs on this layer 6 and the cutting can be carried out with precision.

Figure 4A:
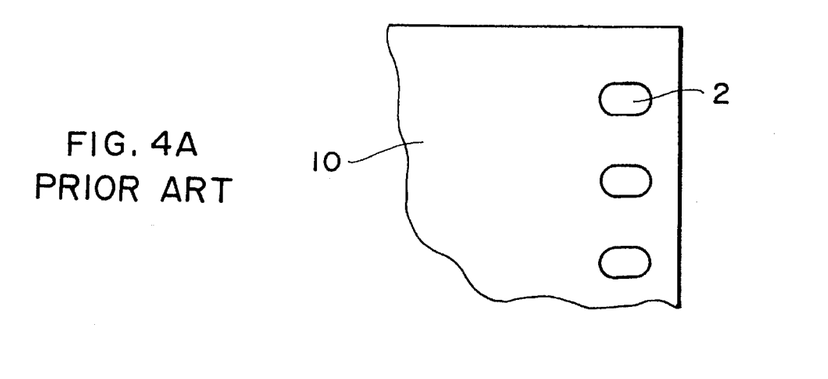
FIGS. 4A–4D are diagrams of a fourth prior art printed circuit board for illustrating sequential process steps for manufacturing the same, FIG. 4A being a diagrammatic plan view of an insulating substrate with holes, FIGS. 4B and 4C being diagrammatic sectional views and FIG. 4D being a diagrammatic plan view of the substrate being processed.
Figures 4B, 4C:
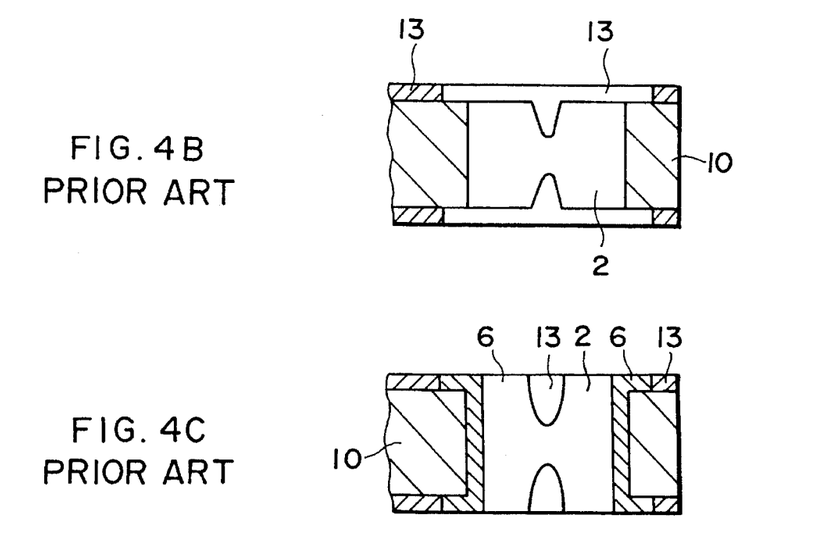
Figure 4D:
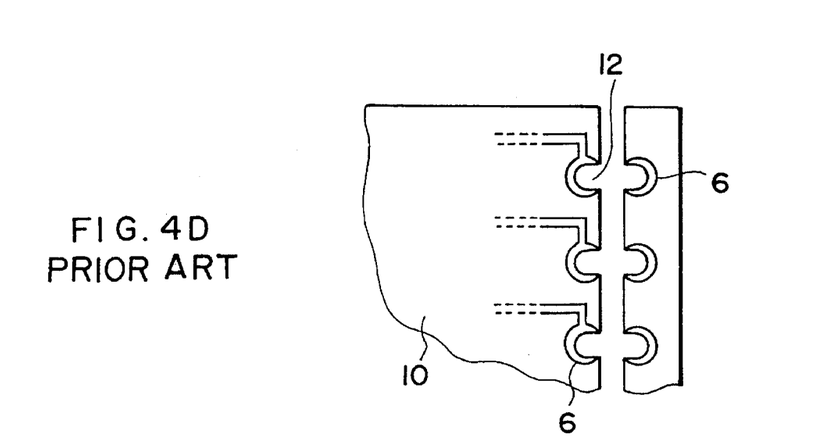

On the other hand, in the fourth prior art example of the method for manufacturing a printed circuit board, first the penetrating hole 2 whose two ends are arc-shaped is provided at an end of an insulating substrate 10. Next, as shown in FIG. 4B, excluding most of the edge of the hole 2, plating resists 13 are applied onto the circumference, the center and a part of the inner wall adjoining thereto of the hole 2 in such a way that the plating resists applied from both the surfaces do not join each other. Then, as shown in FIG. 4C, the edge and the most of the inner wall of the hole 2 are covered by the thick electro-plated copper layer 6. This is followed by, as shown in FIG. 4D, the cutting of the insulating substrate 10 at an approximate center portion of the holes 2 thereby forming of a plurality of semi-circular through-holes 12. According to this method, since there is substantially no existence of the thick electro-plated copper layer 6 at the portion where the semi-circular through-hole 12 is cut, the cutting of the insulating substrate 10 by press for the formation of the semi-circular through-holes 12 does not cause the occurrence of burrs in or peeling of the plated layer.

The problems in the above explained prior art methods include the following:

(1) In the router processing described with reference to FIGS. 1A–1F as the first prior art example, the thick electro-plated copper layer 6 within the through-hole 7 is pulled towards the advancing direction of the router 9 during the cutting operation, and this causes the burrs 8 to develop at side surfaces of the semi-circular through-hole 12. Also, there is a possibility for the thick electro-plated copper layer 6 to be peeled from the inner wall of the semi-circular through-hole 12.

(2) In the metal press processing described with reference to FIGS. 2A–2F as the second prior art example, the thick electro-plated copper layer 6 within the through-hole 7 is pulled downwards during the press operation, and this causes the burrs 8 to develop downwardly of the semi-circular through-hole 12. Also, there are possibilities of occurrence of a damaged portion in a land in the direction underneath the press and of occurrence of the peeling of the thick electro-plated copper layer 6.

(3) In the method described with reference to FIGS. 3A–3G as the third prior art example and the method described as the fourth prior art with reference to FIGS. 4A–4D, where the diameter of the penetrating hole 2 is as small as or smaller than 0.4 mm, it is possible for the entire inner wall thereof to be covered with the plated resist 13 because the viscosity of the plating resist ink applied on the inner wall of the penetrating hole 2 is low and flows thereby making it difficult to control the quantity of the plating resist 13 to be applied. Under this state, in the copper plating process to follow, the thick electro-plated copper layer 6 cannot be formed properly, thereby presenting a problem as to the reliability of the semi-circular through-hole 12.

SUMMARY OF THE INVENTION

An object of the invention, therefore, is to provide a method for manufacturing a printed circuit board in which a thick electro-plated copper layer on an inner wall of a semi-circular through-hole and on a land is free from the development of burrs or peeling-off during the process of forming the semi-circular through-holes, thereby ensuring the reliability thereof.

According to one aspect of the invention, there is provided a method for manufacturing a printed circuit board, the method comprising the steps of:

forming a plurality of penetrating holes at predetermined locations along a straight line on a laminate board whose two surfaces are copper plated;

forming a plurality of semi-circular grooves by cutting the penetrating holes into halves by a slit forming process; and forming a plurality of semi-circular through-holes by using a jig member inserted into the slit and forming a copper plated layer on a surface of each of the semi-circular grooves.

According to the invention, after the formation of the semi-circular grooves by the slit forming process, the copper plating is provided and the semi-circular through-holes are formed. This provides the following advantages:

(1) Because there are no possibilities for the peeling off and or burrs to occur in the copper plated layer, the semi-circular through-holes attained are highly reliable.

(2) Because the entire wall surface of the semi-circular groove is exposed, the accurate copper plating of a predetermined thickness can be obtained, and this enables the enhancement of reliability of the through-holes formed.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, embodiments of the invention are explained with reference to the drawings.

Figure 5A:
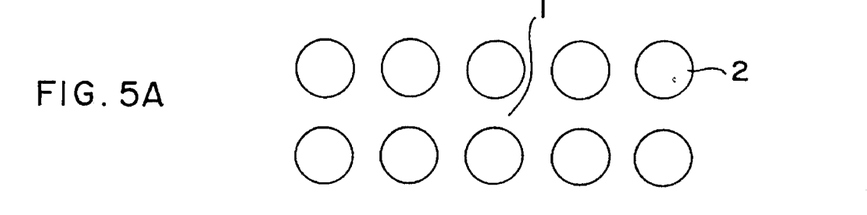
FIGS. 5A–5F are diagrammatic plan views of a printed circuit board of a first embodiment according to the invention for illustrating sequential process steps for manufacturing the same.
Figure 5B:
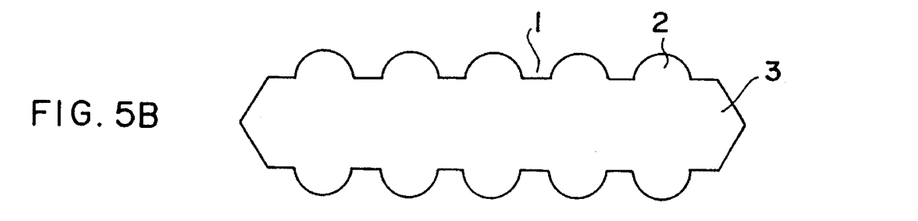
Figure 5C:
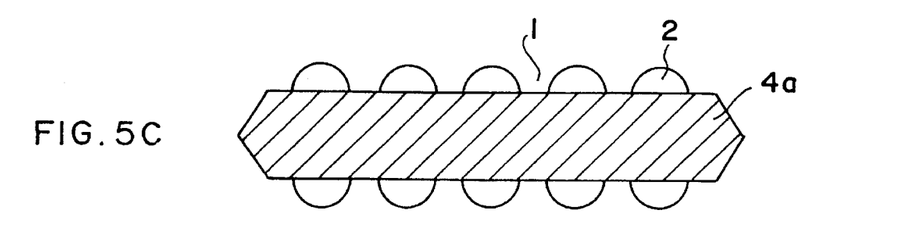
Figure 5D:
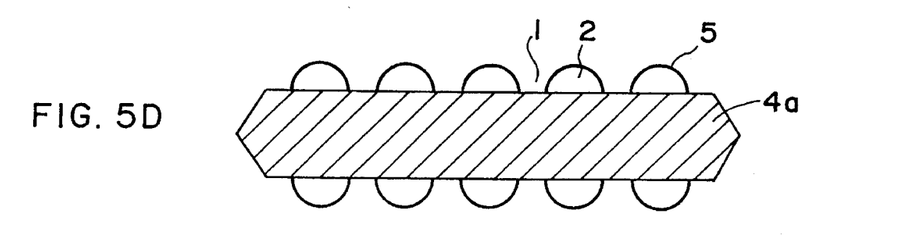
Figure 5E:
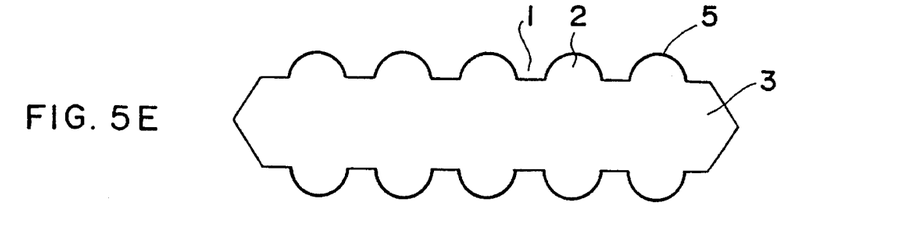
Figure 5F:
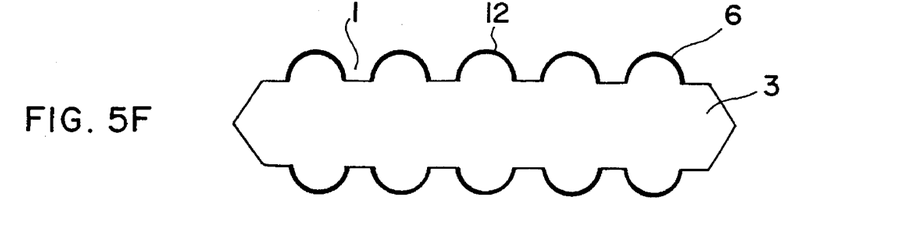
Figure 6:
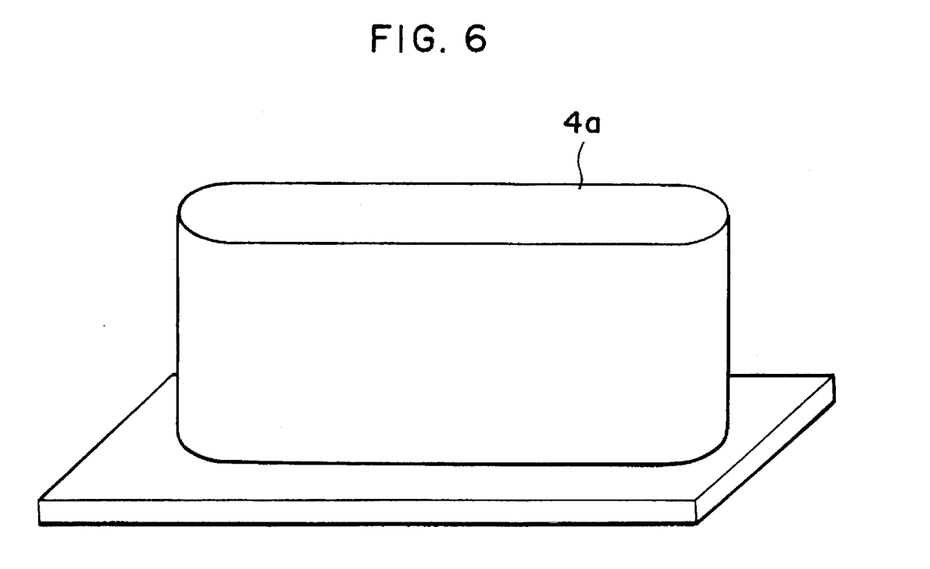
FIG. 6 is a perspective view showing a projected jig member shown in FIGS. 5C and 5D.

FIGS. 5A–5F are diagrams for illustrating sequential steps of a process of a first embodiment according to the invention, and FIG. 6 is a perspective view of a projected jig member used in processing the structure shown in FIGS. 5A–5F. In this first embodiment of the invention, as shown in FIG. 5A, a laminate board 1 which is 1.2 mm thick with two surfaces thereof being copper-plated is provided, by using a drill having a diameter of 0.50 mm, with a plurality of penetrating holes 2 which are lined up on a straight line. This two-surface copper plated laminate board may be a multi-layer laminate board.

Next, as shown in FIG. 5B, a 2 mm wide slit 3 is formed by such process as a router process in such a way that each of the penetrating holes 2 becomes a semi-circular groove and, as shown in FIG. 5C, a projected jig member 4a whose side faces are flat as shown in FIG. 6 is inserted into the slit 3, whereby only a wall surface of each of the semi-circular grooves is exposed. Here, since the projected jig member 4a must be resilient so as to be in tight contact with the slit, the material used for the projected jig member 4a is silicon rubber.

Then, as shown in FIG. 5D, the structure in the state in which the projected jig member 4a is inserted in the slit 3 is subjected to electroless copper plating thereby forming a thin electroless plated layer 5 having a thickness of 1 µm on the semi-circular grooves. Thereafter, as seen in FIG. 5E, the projected jig member 4a is removed from the slit 3 and, as seen in 5F, an electric copper plating is provided on the thin electroless copper plated layer 5 so that the thickness thereof at the center portion of each of the semi-circular grooves becomes 20 µm. This results in the formation of a thick electro-plated copper layer 6 and in the provision of highly reliable semi-circular through-holes 12.

In the first embodiment of the invention, since no copper plated layer is present at the penetrating holes 2 when the slit 3 is router-processed, there are no possibilities for the burrs or peeling-off to occur in the copper plated layer, and this ensures the provision of highly reliable semi-circular through-holes.

Figure 7A:
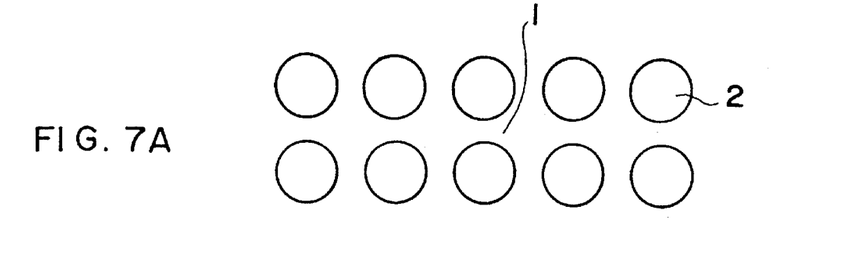
FIGS. 7A–7E are diagrammatic plan views of a printed circuit board of a second embodiment according to the invention for illustrating sequential process steps for manufacturing the same.
Figure 7B:
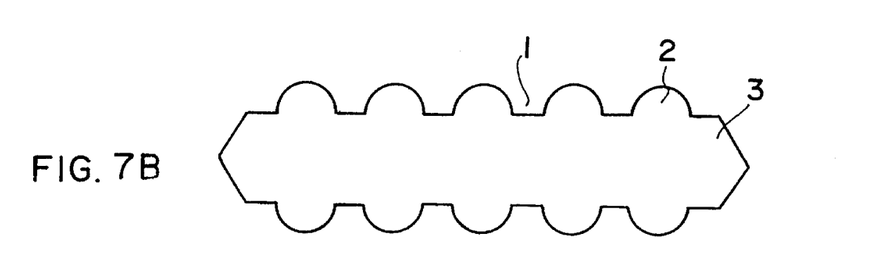
Figure 7C:
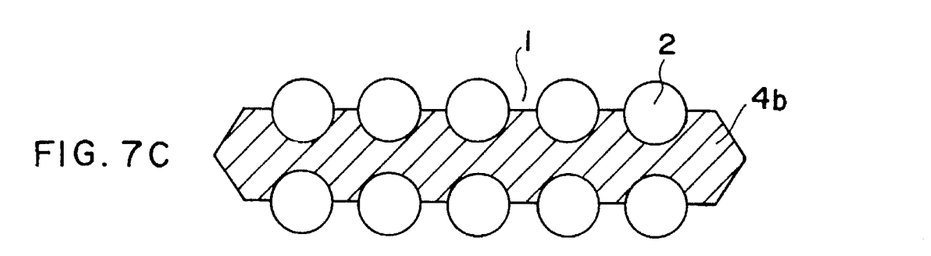
Figure 7D:
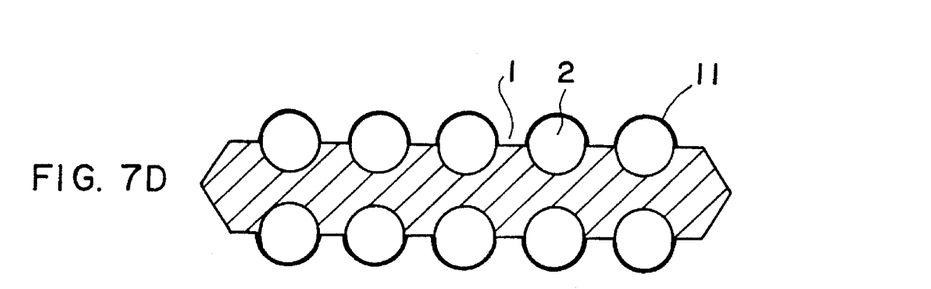
Figure 7E:
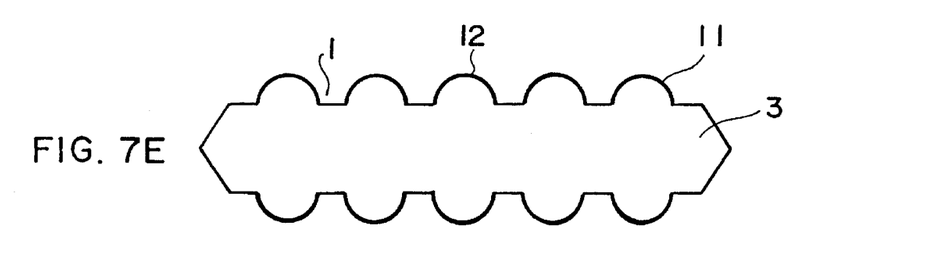
Figure 8:
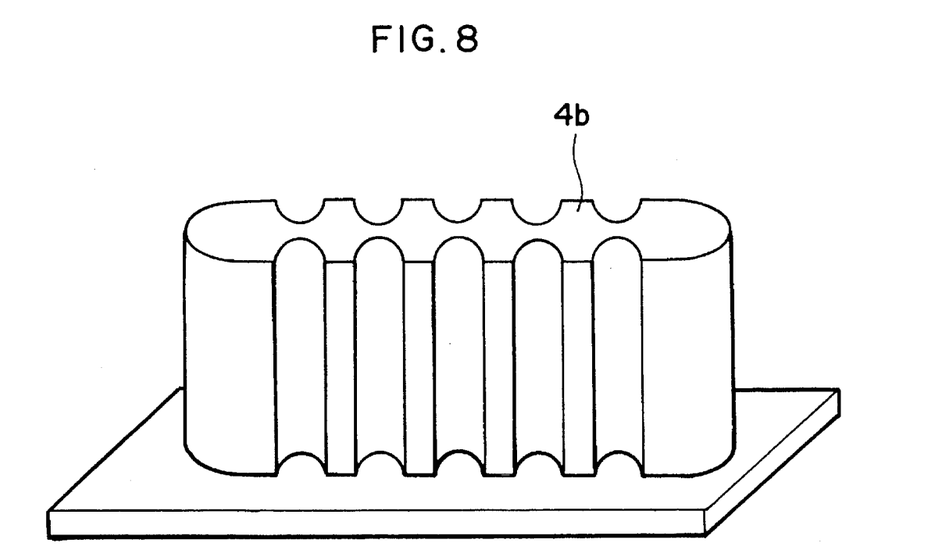
FIG. 8 is a perspective view showing a projected jig member shown in FIGS. 7C and 7D.

FIGS. 7A–7E are diagrams for illustrating sequential steps of a process of a second embodiment according to the invention, and FIG. 8 is a perspective view of a projected jig member used in processing the structure shown in FIGS. 7A–7E. In this second embodiment of the invention, as shown in FIG. 7A, a laminate board 1 which is 1.2 mm thick with two surfaces thereof being copper-plated is provided, by using a drill having a diameter of a 0.50 mm, with a plurality of penetrating holes 2 which are lined up on a straight line. This two-surface copper plated laminate board may be a multi-layer laminate board.

Next, as shown in FIG. 7B, a 2 mm wide slit 3 is formed by such process as a router process in such away that each of the penetrating holes 2 becomes a semi-circular groove and, as shown in FIG. 7C, a projected jig member 4b which has semi-circular grooves back to back on two side surfaces as shown in FIG. 8 is inserted into the slit 3, whereby only a wall surface of each of the semi-circular grooves is exposed. Here, the projected jig member 4b uses silicon rubber as in the first embodiment. The semi-circular grooves provided at the side surfaces of the projected jig member 4b serve to enhance circulation of electroless copper plating liquid.

Then, as shown in FIG. 7D, the structure in the state in which the projected jig member 4b is inserted is subjected to electroless copper plating thereby forming a thick electroless plated copper layer 11 such that the thickness thereof at the center portion of each of the semi-circular grooves has a thickness of 20 µm. Thereafter, as seen in FIG. 7E, the projected jig member 4b is removed from the slit 3 and, as a result, highly reliable semi-circular through-holes 12 are attained.

In the second embodiment, with the process in which the number of steps is one step less, the effect the same as in the first embodiment is achieved.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for manufacturing a printed circuit board, said method comprising the steps of:

forming a plurality of penetrating holes at predetermined locations along a straight line on a laminate board whose two surfaces are copper plated;

forming a plurality of semi-circular grooves by cutting said penetrating holes into halves by a slit forming process; and forming a plurality of semi-circular through-holes by using a jig member inserted into said slit and forming a copper plated layer on a surface of each of said semi-circular grooves.

2. The method for manufacturing a printed circuit board according to claim 1, in which said the plurality of penetrating holes are formed on a multi-layer laminate board whose two surfaces are copper plated.

3. The method for manufacturing a printed circuit board according to claim 1, in which said jig member has flat side surfaces, and said plurality of semi-circular through-holes are formed using said jig member having the flat side surfaces.

4. The method for manufacturing a printed circuit board according to claim 1, in which said jig member has semi-circular grooves on side surfaces, and said plurality of semi-circular through-holes are formed using said jig member having the semi-circular grooves on the side surfaces.

5. The method for manufacturing a printed circuit board according to claim 1, in which said slit is formed using a router process.

6. The method for manufacturing a printed circuit board according to claim 1, in which, after said jig member is removed from said slit, a thin electroless copper plated layer is first formed followed by formation of an electric copper plated layer which results in a thick electric copper plated layer.

* * * * *